(12) United States Patent
Baheti et al.

(10) Patent No.: US 11,916,007 B2
(45) Date of Patent: Feb. 27, 2024

(54) SEMICONDUCTOR DEVICE WITH EMBEDDED FLEXIBLE CIRCUIT

(71) Applicant: Infineon Technologies AG, Neubiberg (DE)

(72) Inventors: Ashutosh Baheti, Munich (DE); Eung San Cho, Torrance, CA (US); Saverio Trotta, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 414 days.

(21) Appl. No.: 16/661,864

(22) Filed: Oct. 23, 2019

(65) Prior Publication Data

US 2021/0125901 A1 Apr. 29, 2021

(51) Int. Cl.
| | |
|---|---|
| H01L 23/66 | (2006.01) |
| H01L 23/498 | (2006.01) |
| H01L 21/48 | (2006.01) |
| H01L 23/00 | (2006.01) |

(52) U.S. Cl.
CPC ........ *H01L 23/4985* (2013.01); *H01L 21/486* (2013.01); *H01L 23/66* (2013.01); *H01L 24/81* (2013.01); *H01L 2223/6677* (2013.01); *H01L 2924/1421* (2013.01)

(58) Field of Classification Search
CPC ..... H01L 23/4985; H01L 24/81; H01L 23/66; H01L 2223/6677; H01L 21/4857; H01L 2924/1421; H01L 23/5383; H01L 23/49822; H01L 21/486; H01Q 1/2283; H01Q 1/243; H01Q 1/38; H01Q 23/00

USPC ........ 257/428, 532, 728, E21.499; 438/106, 438/107; 343/702
See application file for complete search history.

(56) References Cited

U.S. PATENT DOCUMENTS

| | | | |
|---|---|---|---|
| 8,902,060 B2 | 12/2014 | Bertagna et al. | |
| 10,269,716 B2 | 4/2019 | Kasturi et al. | |
| 2006/0202312 A1* | 9/2006 | Iijima | H01Q 1/2283 257/664 |
| 2014/0190727 A1* | 7/2014 | Lee | H05K 1/0204 174/254 |
| 2014/0203703 A1* | 7/2014 | Maatta | H01L 51/50 313/504 |
| 2017/0206447 A1* | 7/2017 | Sandock | H01R 13/627 |
| 2019/0207323 A1* | 7/2019 | Joung | H01Q 9/0407 |
| 2019/0223287 A1* | 7/2019 | Nishida | H05K 5/0069 |
| 2020/0093012 A1* | 3/2020 | Woo | G06F 1/1686 |

(Continued)

FOREIGN PATENT DOCUMENTS

| | | |
|---|---|---|
| CN | 201689452 U | 12/2010 |
| WO | 2007092381 A2 | 8/2007 |
| WO | 2018004867 A1 | 1/2018 |

*Primary Examiner* — David Chen
(74) *Attorney, Agent, or Firm* — Slater Matsil, LLP

(57) ABSTRACT

A semiconductor device includes a substrate comprising an antenna and a conductive feature; an integrated circuit (IC) die attached to the substrate and comprising a radio frequency (RF) circuit; and a flexible circuit integrated with the substrate, where the flexible circuit is electrically coupled to the IC die and the substrate, a first portion of the flexible circuit being disposed between opposing sidewalls of the substrate, a second portion of the flexible circuit extending beyond the opposing sidewalls of the substrate, the second portion of the flexible circuit comprising an electrical connector at a distal end.

13 Claims, 8 Drawing Sheets

(56) References Cited

U.S. PATENT DOCUMENTS

| | | | |
|---|---|---|---|
| 2020/0112081 A1* | 4/2020 | Kim | H05K 1/148 |
| 2020/0163203 A1* | 5/2020 | Park | H05K 1/185 |
| 2020/0178389 A1* | 6/2020 | Min | H05K 1/115 |
| 2020/0365969 A1* | 11/2020 | Lee | H01Q 9/0407 |
| 2020/0413544 A1* | 12/2020 | Gao | H01Q 1/2283 |

* cited by examiner

SEMICONDUCTOR DEVICE WITH EMBEDDED FLEXIBLE CIRCUIT

TECHNICAL FIELD

The present invention relates generally to semiconductor packages, and, in particular embodiments, to antenna-in-package (AiP) devices.

BACKGROUND

Antenna-in-package (AiP) represents a new trend in integrated circuit (IC) packaging which is an enabler of smaller and highly integrated semiconductor devices. An AiP device includes integrated circuits (ICs) (e.g., base-band IC and RF transceiver IC) and an antenna inside a same package. Antenna-in-package allows integration of complex RF components together with base-band circuitry into a self-contained module. AiP devices not only reduce the footprint of the functional modules they integrated, but also facilitate the work of system integrators. For example, the system integrators no longer have to design complex RF circuits at the application printed circuit board (PCB) level. Moreover, the overall size of the complete application is reduced.

As the form factor of mobile devices continues to shrink, the reduced space inside the mobile devices poses new demands and challenges for the design of semiconductor devices inside the mobile devices, such as AiP devices. For example, as the mobile device becomes thinner, the reduced thickness of the mobile device requires that the height of AiP devices be reduced accordingly. There is a need in the art for improved packaging techniques for semiconductor devices such as AiP devices.

SUMMARY

In accordance with an embodiment of the present invention, a semiconductor device includes a substrate comprising an antenna and a conductive feature; an integrated circuit (IC) die attached to the substrate and comprising a radio frequency (RF) circuit; and a flexible circuit integrated with the substrate, where the flexible circuit is electrically coupled to the IC die and the substrate, a first portion of the flexible circuit being disposed between opposing sidewalls of the substrate, a second portion of the flexible circuit extending beyond the opposing sidewalls of the substrate, the second portion of the flexible circuit comprising an electrical connector at a distal end.

In accordance with an embodiment of the present invention, a semiconductor device includes an integrated circuit (IC) comprising a radio frequency (RF) circuit and an RF terminal configured to transmit or receive RF signals; a substrate comprising an antenna proximate to a first side of the substrate facing away from the IC and comprising a conductive feature proximate to a second side of the substrate facing the IC, wherein the IC is attached to the second side of the substrate, and the RF terminal of the IC is electrically coupled to the conductive feature of the substrate; and a flexible circuit attached to the substrate, wherein the flexible circuit is electrically coupled to the IC and the substrate, wherein a first segment of the flexible circuit is disposed within lateral extents of the substrate, and a second segment of the flexible circuit is disposed outside the lateral extents of the substrate, the second segment of the flexible circuit comprising an electrical connector.

In accordance with an embodiment of the present invention, a method of forming an electrical device includes attaching a first portion of a flexible circuit to a first substrate, wherein the first substrate comprises an antenna in a first metal layer of the first substrate, wherein a second portion of the flexible circuit extends beyond lateral extents of the first substrate after the attaching, the second portion of the flexible circuit having an electrical connector at a distal end; and bonding a radio frequency integrated circuit (RFIC) to a first surface of the first substrate, wherein after the bonding, the RFIC is electrically coupled to the first substrate and the flexible circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
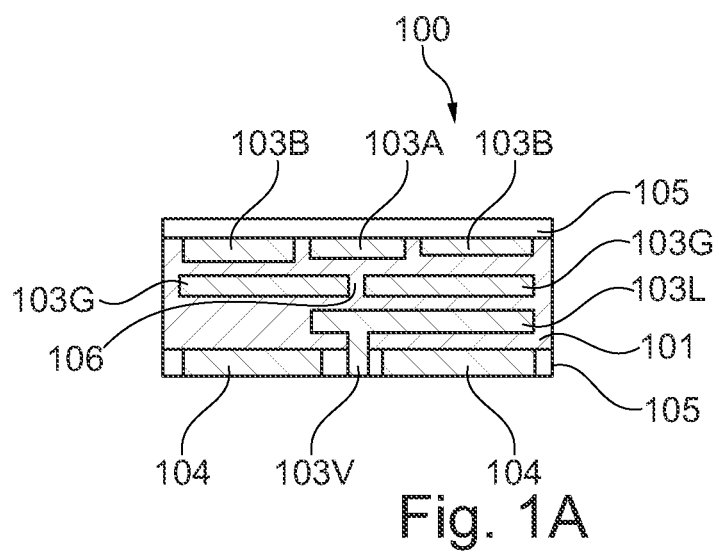
FIGS. 1A-1C illustrate cross-sectional views of an antenna-in-package (AiP) device at various stages of fabrication, in accordance with an embodiment.

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion herein, unless otherwise specified, the same or similar reference numeral in different figures refers to the same or similar component. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present invention will be described with respect to example embodiments in a specific context, namely antenna-in-package (AiP) devices with embedded flexible circuit. Note that AiP devices are used in the description herein as non-limiting examples. The scope of the present invention includes semiconductor devices other than AiP devices. For instance, such devices differ from an AiP device in that the one or more antennas they comprise are not located within their substrate, but on one or more outer surface thereof. In other words, non-AiP semiconductor devices with embedded flexible circuit are also included within the scope of the present disclosure. For example, the AiP device in the various disclosed embodiments herein may be replaced by another semiconductor device (e.g., a non-AiP device) that has a multi-layered structure. These and other variations are fully intended to be included within the scope of the present disclosure.

In embodiments of the present invention, a flexible circuit is attached to a substrate such that a first portion of the flexible circuit is within lateral extents of the substrate and a second portion of the flexible circuit is outside the lateral extents of the substrate. The substrate has one or more antennas formed in a metal layer of the substrate. The flexible circuit is electrically coupled to conductive features of the substrate. The second portion of the flexible circuit has an electrical connector for connection with an external circuit. A radio-frequency integrated circuit (RFIC) is bonded to the substrate, and is electrically coupled to the flexible circuit and the substrate. Electrical connections between the RFIC and external circuits are achieved through the electrical connector of the flexible circuit. RF signals are transmitted from or received by the RFIC using the one or more antennas in the substrate, which one or more antennas are electromagnetically coupled to an RF terminal of the RFIC. The substrate, with the flexible circuit and the RFIC attached, form an AiP device with embedded flexible circuit. The disclosed embodiments reduce the height of the AiP device formed, which allows the AiP device to be embedded in various positions and at various angles within the bezel of a mobile device, in some embodiments.

Figure 1B:
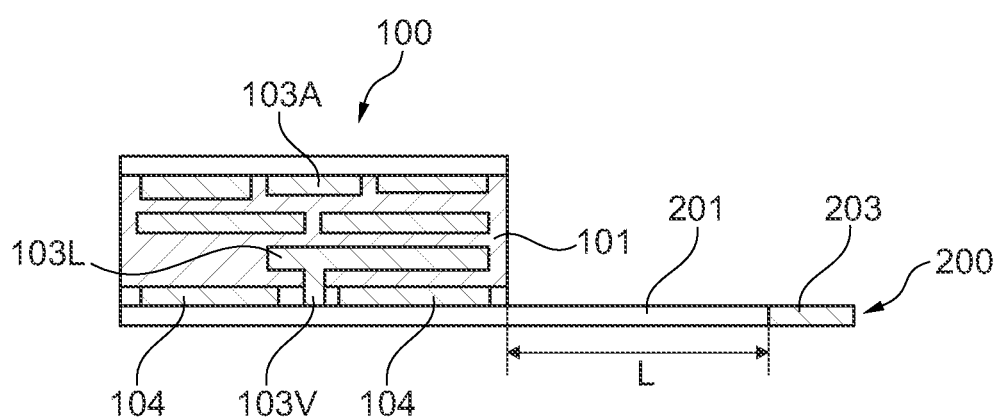
Figure 1C:
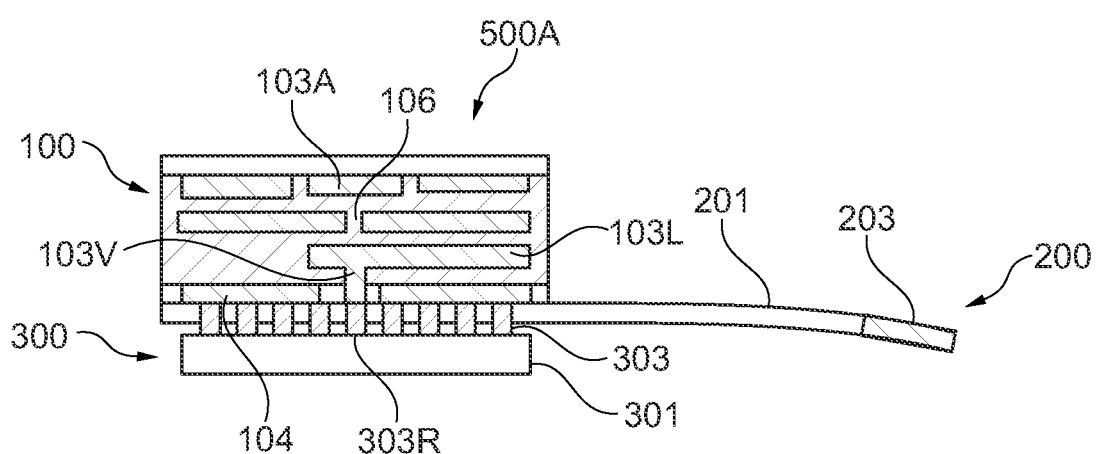

Referring now to FIGS. 1A-1C, which illustrate cross-sectional views of an AiP device 500A at various stages of fabrication, in accordance with an embodiment. FIG. 1A illustrates a substrate 100 (e.g., a printed circuit board (PCB)), which includes one or more dielectric layers 101 and electrically conductive features (e.g., metal lines and vias) formed in the one or more dielectric layers 101. The electrically conductive features are formed in one or more metal layers of the substrate. The substrate 100 may also include solder resist layers 105 on the upper surface and the lower surface of the one or more dielectric layers 101.

The one or more dielectric layers 101 may be formed of any suitable dielectric material, such as resin or fiber glass. For example, bismaleimide triazine (BT) resin, FR-4 (a composite material composed of woven fiberglass cloth with an epoxy resin binder that is flame resistant), ceramic, glass, plastic, tape, film, or other supporting materials may be used as the dielectric material of the one or more dielectric layers 101. In the illustrated embodiment, the substrate 100 includes at least one antenna (e.g., 103A) and is designed for radio frequency (RF) applications. Accordingly, the one or more dielectric layers 101 may be formed using low-loss high frequency materials such as a woven glass reinforced hydrocarbon/ceramic, or polytetrafluoroethylene (PTFE). Example dielectric materials include Rogers 400C, 4350, 3003 from Rogers Corporation, Mitsubishi HL972LF, HL970LF from Mitsubishi, or Panasonic Megtron Series from Panasonic. Each of the dielectric layers 101 may have a thickness between, e.g., about 50 µm and about 400 µm, although other suitable thickness may also be used.

The conductive features 103 (e.g., 103L, 103V, 103G, 103A, 103B) of the substrate 100 include conductive lines (e.g., copper lines) and vias (e.g., copper vias) formed using a suitable formation method. For example, copper may be deposited over a dielectric layer to form a metal layer, and the deposited metal layer is then patterned to form metal lines. As another example, openings or recesses may be formed in a dielectric layer, and copper is formed in the openings or recesses to form conductive features such as vias. Throughout the description herein, copper is used as an example of the material for forming the conductive features, with the understanding that other suitable conductive materials, such as aluminum, tungsten, cobalt, gold, silver, combinations thereof, alloys thereof, or the like, may also be used to form the various conductive features. Depending on the design of the substrate 100, the number of metal layers in the substrate 100 may be between, e.g., 2 and 10, although other numbers of metal layers are also possible. The configuration of the substrate 100 (e.g., the locations and interconnections of the conductive features 103) illustrated in FIG. 1A (or other figures) is simply an example and not limiting. Depending on the design of the substrate 100, other configurations of the substrate 100 are also possible and are fully intended to be included within the scope of the present disclosure.

In the example of FIG. 1A, the conductive features of the substrate 100 include conductive lines 103L and vias 103V. The via 103V illustrated in FIG. 1 (e.g., proximate to the lower surface of the substrate 100) is electrically coupled to an RF terminal (e.g., 303R) of an RFIC 300 in subsequent processing (see FIG. 1C). FIG. 1A further illustrates an antenna 103A (e.g., a copper patch antenna) proximate to the upper surface of the substrate 100, and a ground plane 103G between the antenna 103A and the conductive line 103L. The ground plane 103G is a copper plane electrically coupled to a reference voltage level, such as electrical ground, in some embodiments. In FIG. 1A, the ground plane 103G has an opening 106 (e.g., a through-hole) disposed between the antenna 103A and the conductive line 103L. FIG. 1A further illustrates conductive patterns 103B disposed in a same metal layer with the antenna 103A, which conductive patterns 103B may be additional antennas. For example, the substrate 100 may have two or more antennas for transmitting and receiving RF signals at the same time.

In addition, FIG. 1A illustrates conductive features 104 (e.g., copper pads) formed in the solder resist layer 105 at the lower surface of the substrate 100. The conductive features 104 are used for bonding with the flexible circuit 200 in subsequent processing (see FIG. 1B), and are formed by, e.g., forming openings in the solder resist layer 105, then plating a conductive material (e.g., copper) in the openings, in some embodiments. Although not illustrated in FIG. 1A, the conductive features 104 are electrically coupled to the conductive features 103 of the substrate 100.

Next, in FIG. 1B, a flexible circuit 200 is attached to the lower surface of the substrate 100. The flexible circuit 200 includes a cable 201 and a connector 203 (e.g., an electrical connector) at the end of the cable 201. The cable 201 includes one or more conductive layers (e.g., copper layers) formed in a suitable dielectric material such as polyimide. Example dielectric materials for the flexible circuit 200 include Pyralux AP or Pyralux LF Coverlay from DuPont. The connectors 203 are used for electrical connection to another workpiece (e.g., another PCB, another electrical component). Note that while the flexible circuit 200 is flexible (e.g., can be folded, bent, twisted, or the like during normal operation), the substrate 100 is a rigid substrate (e.g., a PCB), which does not change its shape or dimension under normal working conditions.

As illustrated in FIG. 1B, a first portion (may also be referred to as a first segment) of the flexible circuit 200 is disposed within lateral extents of the substrate 100, and a second portion (may also be referred to as a second segment) of the flexible circuit 200 is disposed outside the lateral extents of the substrate 100. In other words, the first portion of the flexible circuit 200 is disposed between opposing sidewalls of the substrate 100, and the second portion of the flexible circuit 200 is disposed beyond the opposing sidewalls of the substrate 100. In some embodiments, the portion of cable 201 of the flexible circuit 200 that is disposed beyond opposing sidewalls of the substrate 100 has a length L between about 0.5 mm and about 10 mm, such as between about 0.5 mm and about 5 mm. In other embodiments, the length L is more than 10 mm, depending on, e.g., the design and/or the application of the device.

In some embodiments, the portion of cable 201 of the flexible circuit 200 that is disposed beyond opposing sidewalls of the substrate 100 has a width between about 0.2 mm and about 5 mm. In other embodiments, the width is more than 5 mm, e.g. about 10 mm or more, depending on, e.g., the design and/or the application of the device.

In some embodiments, the first portion of the flexible circuit 200 has conductive features (e.g., copper pads, not shown) that are exposed at the upper surface of the cable 201. The flexible circuit 200 may be attached to the lower surface of the substrate 100 by direct metal-to-metal bonding. In other words, the conductive features 104 of the substrate 100 and the exposed conductive features of the flexible circuit 200 are bonded together by a direct metal-to-metal bonding process. In other embodiments, the flexible circuit 200 is mechanically and electrically coupled to the lower surface of the substrate 100 (e.g., the conductive features 104) using a conductive glue or a conductive paste. In yet other embodiments, the conductive features 104 are not formed in the solder resist layer 105, in which case openings (e.g., through-holes) are formed at the lower surface of the substrate 100 that extend through portions of the dielectric layer 101 to expose some of the conductive features 103 (e.g., 103L, 103V) of the substrate 100, and a plating process (e.g., electro-plating or electro-less plating) is performed to fill the openings with a conductive material (e.g., copper), thereby forming conductive patterns (see, e.g., vias 205 in FIG. 2B) that are exposed at the lower surface of the substrate. The flexible circuit 200 may then be mechanically and electrically coupled to the conductive patterns at the lower surface of the substrate using a suitable method, such as direct metal-to-metal bonding, conductive glue, or conductive paste.

Next, in FIG. 1C, a radio frequency integrated circuit (RFIC) 300 is attached to the lower surface of the substrate 100, such that the first portion of the flexible circuit 200 is disposed between the substrate 100 and the RFIC 300. The RFIC 300 is an integrated circuit (may also be referred to as an IC die) that comprises an RF circuit (e.g., a circuit designed for processing radio frequency signals). The RFIC 300 may additionally include other circuits, such as a baseband processing circuit. After being attached, the RFIC 300 is electrically coupled to the flexible circuit 200 and the substrate 100. The semiconductor structure illustrated in FIG. 1C, which includes the substrate 100, the flexible circuit 200, and the RFIC 300, is referred to as an AiP device 500A with embedded flexible circuit 200, or an AiP device 500.

As illustrated in FIG. 1C, the RFIC 300 includes a semiconductor substrate 301, such as silicon, doped or un-doped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaIAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 301 and may be interconnected by interconnect structures formed by, for example, metallization patterns in one or more dielectric layers over the semiconductor substrate 301 to form an integrated circuit. Die connectors 303 (e.g., copper pillars) of the RFIC 300 are formed at a front side of the RFIC 300 and provide electrical connection to the circuits of the RFIC 300.

Figure 1D:
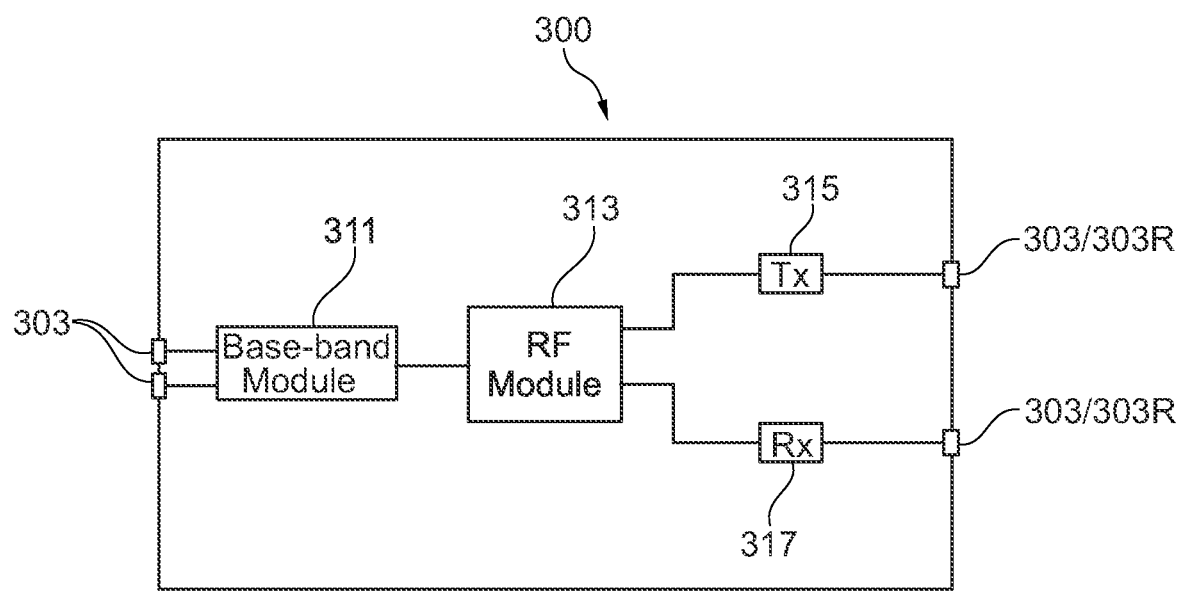
FIG. 1D illustrates a functional block diagram of a radio frequency integrated circuit (RFIC), in accordance with an embodiment.

Referring temporarily to FIG. 1D, which illustrates a functional block diagram of the RFIC 300, in an embodiment. Note that for simplicity, not all functional blocks of the RFIC 300 are illustrated in FIG. 1D. In the example of FIG. 1D, the RFIC 300 includes a base-band module 311, an RF module 313, a Tx module 315, and an Rx module 317. The base-band module 311 is designed to perform digital base-band processing functions, such as digital filtering, equalization, digital re-sampling, or the like. The RF module 313 is designed to handle RF signals and perform RF related functions, such as modulating or demodulating RF signals. The RF module 313 may include RF related components such as mixers, oscillators, or the like. Depending on the design of the RFIC 300, analog-to-digital converters (ADCs) and/or digital-to-analog converters (DACs) may be formed in the RF module 313 or in the base-band module 311. The Tx module 315 is designed to perform functions related with transmitting RF signals, and may include electrical components such as power amplifiers. The Rx module 3157 is designed to perform functions related with receiving RF signals, and may include electrical components such as analog filters, lower-noise amplifiers, or the like. The RFIC 300 is electrically coupled to external circuits through die connectors 303. FIG. 1D further illustrates RF terminals 303R (e.g., die connectors connected to the Tx or Rx modules) which are electrically coupled to the Tx module 315 and/or to the Rx module 317. In some embodiments, the RFIC 300 includes the Tx module 315 but does not include the Rx module 317. In other embodiments, the RFIC 300 includes the Rx module 317 and does not include the Tx module 315. These and other variations are fully intended to be included within the scope of the present disclosure.

Referring back to FIG. 1C, to attach the RFIC 300 to the substrate 100, one or more opening (e.g., through-holes) is formed in the cable 201 to expose at least portions of the conductive features 104, and the die connectors 303 extend through the opening(s) to connect with the conductive features 104 (e.g., using a soldering process), in some embodiments. In other words, the RFIC 300 is connected to the conductive feature(s) 104 of the substrate through the flexible circuit. In the illustrated example, some of the die connectors 303 (e.g., the RF terminal 303R) are coupled to conductive features (e.g., the via 103V) exposed at the lower surface of the substrate 100. In embodiments where the conductive features 104 are not formed, openings may be formed that extend through the cable 201, the solder resist layer 105, and portions of the dielectric layer 101 to expose some conductive features 103 of the substrate 100, and a plating process may be performed to fill the openings with a conductive material to form vias. The RFIC 300 may then be bonded to the vias using, e.g., solder. Besides the above described methods to attach the RFIC 300 to the substrate 100, other methods are also possible and are fully intended to be included within the scope of the present disclosure.

In the example of FIG. 1C, an RF terminal 303R of the RFIC 300, which is configured to send or receive RF signals, is electrically coupled to the conductive features (e.g., 103V and 103L) of the substrate 100. In embodiments where the antenna 103A is a transmission antenna, the RF signal generated by the RFIC 300 is electrically coupled to the conductive features 103L through the via 103V and the RF terminal 303R. The conductive feature 103L radiates the RF signal, which travels through the opening 106 and is electromagnetically coupled to the antenna 103A. The RF signal is then transmitted by the antenna 103A. In embodiments where the antenna 103A is a receive antenna, the antenna 103A picks up the RF signal (e.g., through electromagnetic coupling), the received RF signal is then electromagnetically coupled to the RF terminal 303R, e.g., through the opening 106 and the conductive features 103L/103V.

Note that in the example of FIG. 1C, electrical connection between the RFIC 300 and external circuits, such as another PCB or other electrical component, is achieved by the connector 203 of the flexible circuit 200. The connector 203 may have a plurality of connection pins, a plurality of conductive pads, or the like, to provide electrical connection for multiple signals. As a result of using the flexible circuit 200 for the electrical connection between the RFIC 300 and external circuits, there is no need to form a plurality of external connectors (e.g., solder bumps, conductive pillars) at the lower surface of the substrate 100. This advantageously reduces the height of the AiP device 500A, which allows the AiP device 500A to be used in applications where the height available for the AiP device is limited (see FIGS. 5A, 5B, 6A, and 6B and related discussions hereinafter).

Figure 2A:
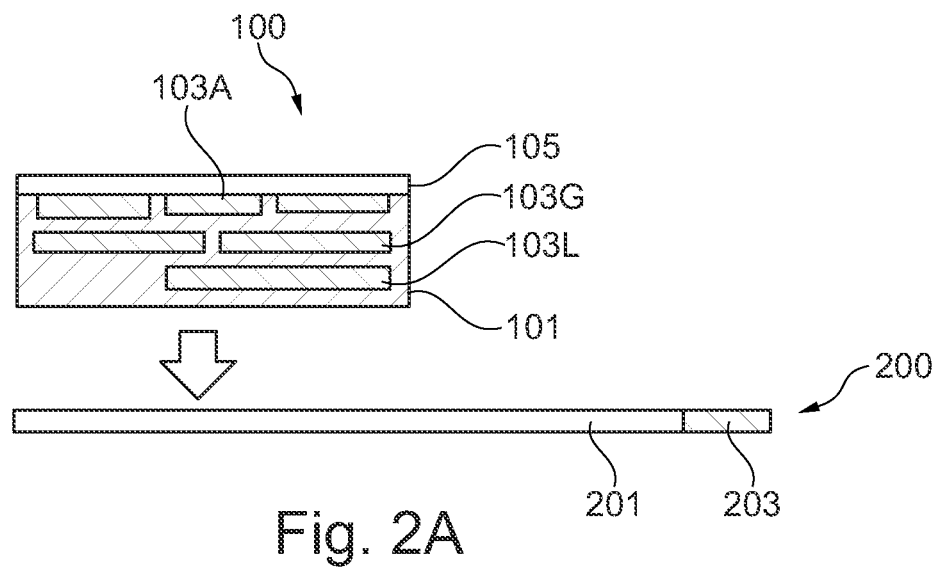
FIGS. 2A-2C illustrate cross-sectional views of an antenna-in-package (AiP) device at various stages of fabrication, in accordance with an embodiment.
Figure 2B:
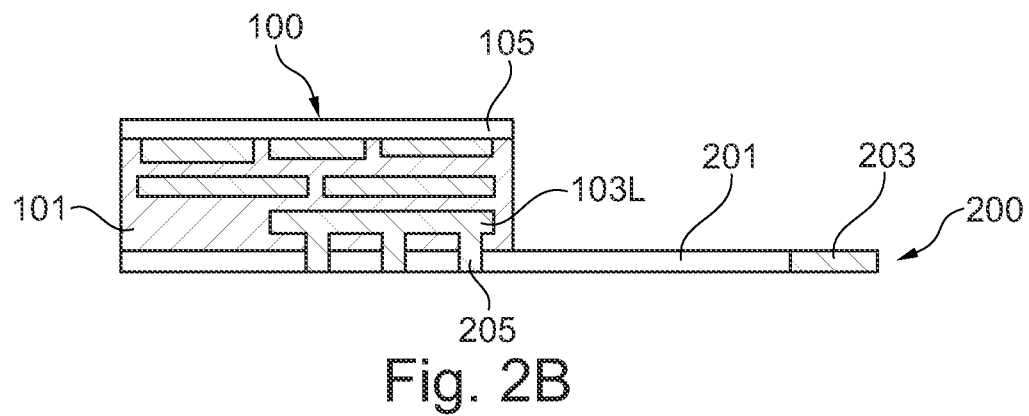
Figure 2C:
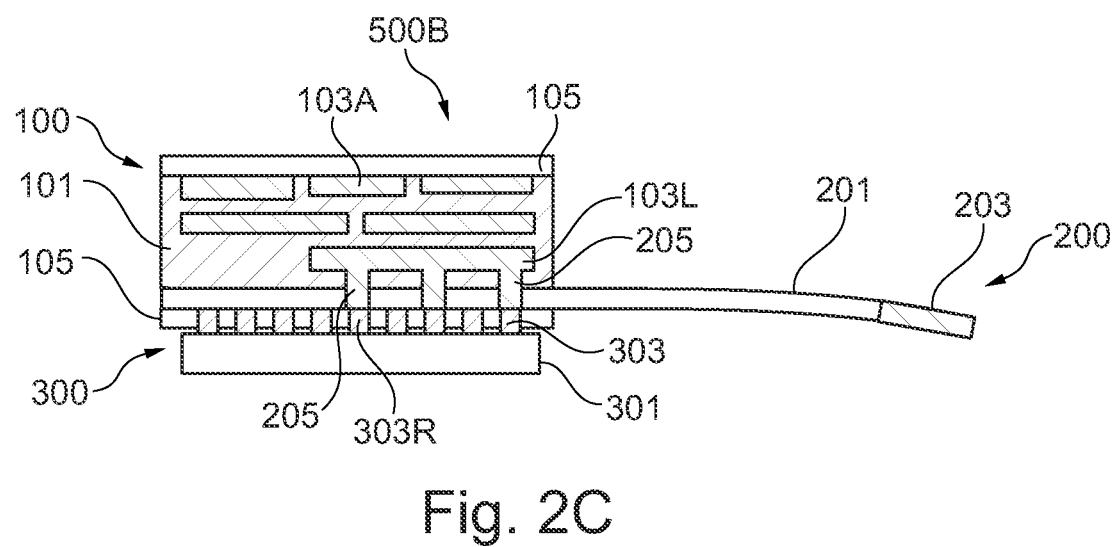

FIGS. 2A-2C illustrate cross-sectional views of an AiP device 500B with embedded flexible circuit 200 at various stages of fabrication, in accordance with an embodiment. The formation process of the AiP device 500B is similar to that of AiP device 500A, but the substrate 100 in FIG. 2A does not have conductive features (e.g., 104 in FIG. 1A) exposed at the lower surface of the substrate 100. In addition, the substrate 100 in FIG. 2A does not have the solder resist layer 105 at the lower surface of the substrate 100.

Referring to FIG. 2A, the flexible circuit 200 is attached to the substrate 100 using a dielectric-to-dielectric bonding process. The high temperature and the high pressure of the dielectric-to-dielectric bonding process bond the dielectric material (e.g., polyimide) of the flexible circuit 200 with the dielectric material (e.g., woven glass reinforced hydrocarbon/ceramic, or PTFE) of the substrate 100, thereby bonding the flexible circuit 200 to the substrate 100.

Next, in FIG. 2B, openings (e.g., through-holes) are formed in the flexible circuit 200 using, e.g., a laser drilling process or an etching process. The openings extends through the flexible circuit 200 and a portion of the dielectric layer 101 of the substrate 100 to expose some of the conductive features 130 (e.g., 130L) of the substrate 100. Next, a plating process (e.g., an electro-plating process or an electroless plating process) is performed to fill the openings with a conductive material (e.g., copper) to form conductive features, such as vias 205. In some embodiments, the openings are formed to extend through conductive regions (e.g., copper regions) of the flexible circuit 200, and therefore, the vias 205, once formed, are electrically coupled to the flexible circuit 200. In some embodiments, the openings are formed in regions of the flexible circuit 200 that do not have conductive features, and therefore, the vias 205 extend through dielectric regions (e.g., polyimide regions) of the cable 201. Next, an optional solder resist layer 105 may be formed on the lower surface of the flexible circuit 200 (see FIG. 2C).

Next, in FIG. 2C, the RFIC 300 is attached to the lower surface of the substrate 100, thereby forming the AiP device 500B with embedded flexible circuit. To attach the RFIC 300, openings are formed that extend through the solder resist layer 105 (if formed) to expose the vias 205. The openings may also extend partially through the dielectric material of the flexible circuit 200 to expose conductive features of the flexible circuit 200. The die connectors 303/303R of the RFIC 300 extend through the openings and are bonded (e.g., using solder) to the vias 205 and/or the exposed conductive features of the flexible circuit 200, in some embodiments.

Figure 3A:
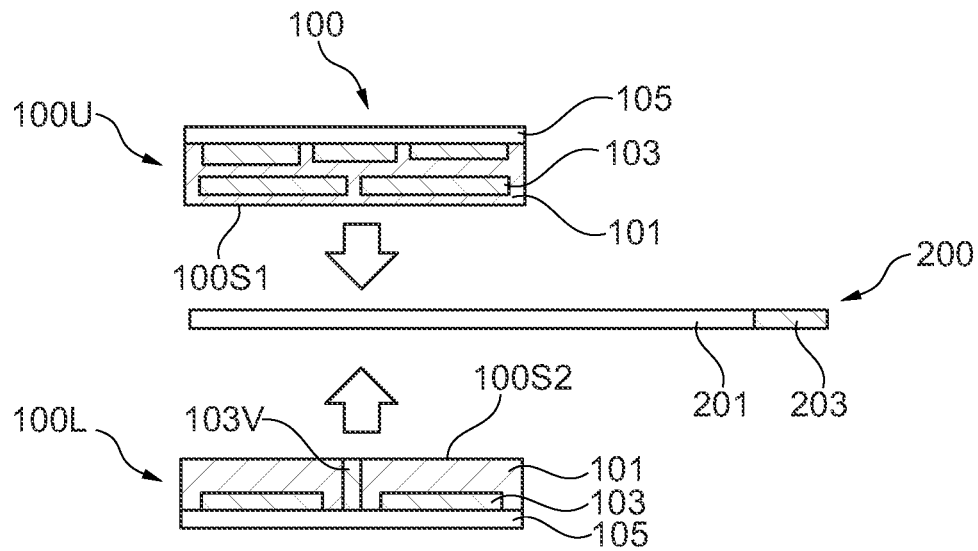
FIGS. 3A-3C illustrate cross-sectional views of an antenna-in-package (AiP) device at various stages of fabrication, in accordance with an embodiment.
Figure 3B:
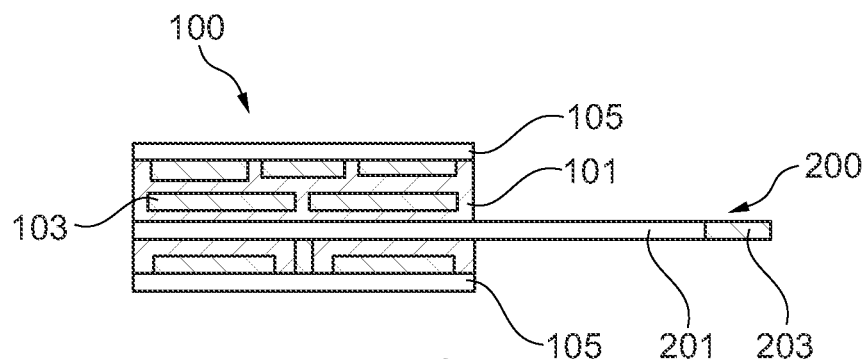
Figure 3C:
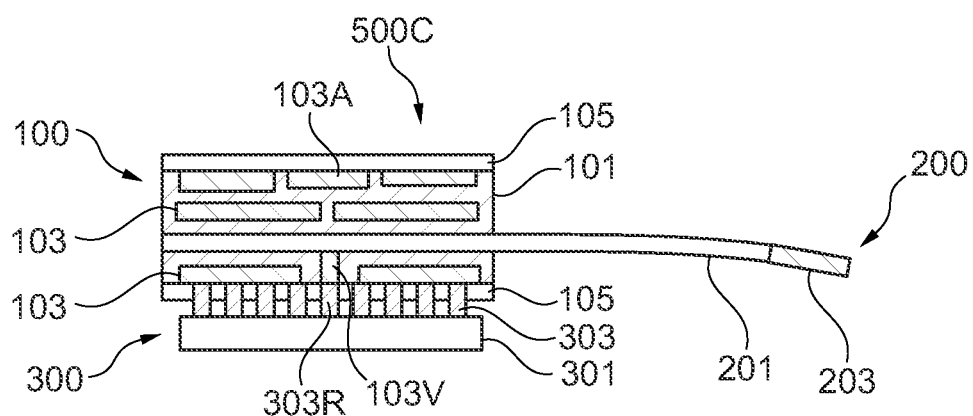

FIGS. 3A-3C illustrate cross-sectional views of an AiP device 500C with embedded flexible circuit 200 at various stages of fabrication, in accordance with an embodiment. The formation process of the AiP device 500C is similar to that of AiP device 500B, but the substrate 100 in FIG. 3A includes an upper portion 100U and a lower portion 100L. The flexible circuit 200 is laminated between the upper portion 100U and the lower portion 100L.

As illustrated in FIG. 3A, the upper surface of the flexible circuit 200 is attached to a lower surface 100S1 of the upper portion 100U of the substrate 100, and the lower surface of the flexible circuit 200 is attached to an upper surface 100S2 of the lower portion 100L. Depending on whether there are conductive features exposed at the lower surface 100S1 or at the upper surface 100S2, the flexible circuit 200 may be attached to the upper portion 100U and the lower portion 100L using any suitable method such as direct metal-to-metal bonding, dielectric-to-dielectric bonding, conductive paste, conductive glues, or the like, similar to the processes discussed above for the AiP devices 500A and 500B. Although not illustrated, a drilling process may be performed to form openings in the upper portion 100U and/or the lower portion 100L, and a plating process may be performed to fill the openings with a conductive material (e.g., copper) to form conductive features in the upper portion 100U and/or the lower portion 100L for electrically connection with the flexible circuit 200, similar to the process discussed above for the AiP device 500B.

FIG. 3B illustrates the substrate 100 with embedded flexible circuit 200, after the processing of FIG. 3A is finished. As illustrated in FIG. 3B, the upper portion 100U and the lower portion 100L are joined together and form a single substrate 100, with the flexible circuit 200 laminated in between. The flexible circuit 200 is electrically coupled to the substrate 100, and may function as a middle metal layer of the substrate 100.

Next, in FIG. 3C, the RFIC 300 is attached to the lower surface of the substrate 100, and is electrically coupled to the substrate 100 and the flexible circuit 200, thereby forming the AiP device 500C. The RFIC 300 may be attached by forming openings in the solder resist layer 105 to expose conductive features 103 of the substrate 100, and bonding the die connectors 303/303R of the RFIC 300 to the exposed conductive features 103.

FIGS. 4A-4D illustrate various views (e.g., cross-sectional views, top view) of an AiP device 500D with embedded flexible circuit at various stages of fabrication, in accordance with an embodiment. The formation process of the AiP device 500D is similar to that of AiP device 500B, but the flexible circuit 200 is attached to the upper surface of the substrate 100.

Figure 4A:
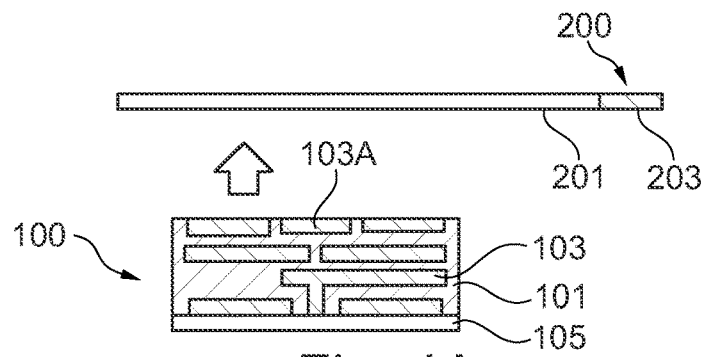
FIGS. 4A-4D illustrate various views of an antenna-in-package (AiP) device at various stages of fabrication, in accordance with an embodiment.

In FIG. 4A, the antenna 103A is at the upper surface of the substrate 100. The flexible circuit 200 is attached to the upper surface of the substrate 100 using any suitable methods, such as those discussed above for the AiP devices 500A, 500B, and 500C.

Figure 4B:
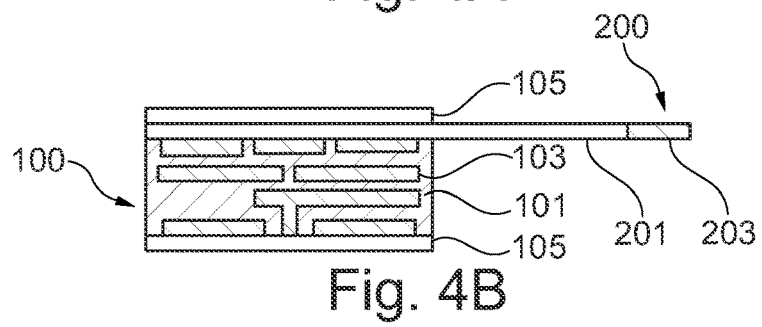

FIG. 4B shows the substrate 100 with the flexible circuit 200 attached. The flexible circuit 200 is electrically coupled to the substrate 100 after being attached. Next, a solder resist layer 105 is formed over the upper surface of the flexible circuit 200. In other embodiments, the solder resist layer 105 is omitted.

Figure 4C:
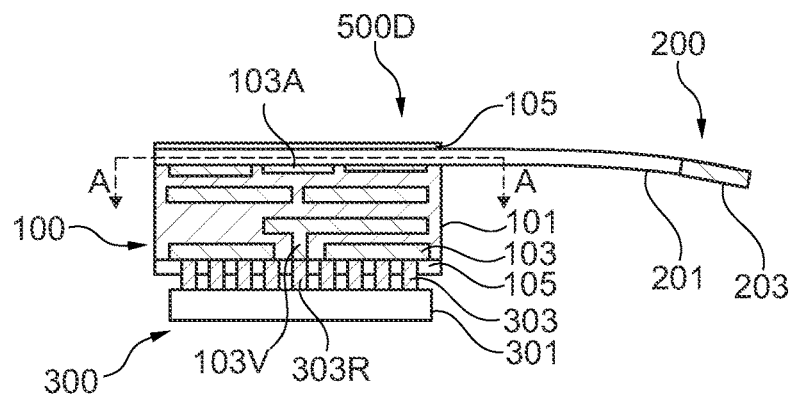

Next, in FIG. 4C, the RFIC 300 is mechanically and electrically coupled to the lower surface of the substrate 100, using any suitable method, such as the process described above for the AiP device 500C of FIG. 3C, thereby forming the AiP device 500D. The RFIC 300 is also electrically coupled to the flexible circuit 200 through the metal layers of the substrate 100.

Figure 4D:
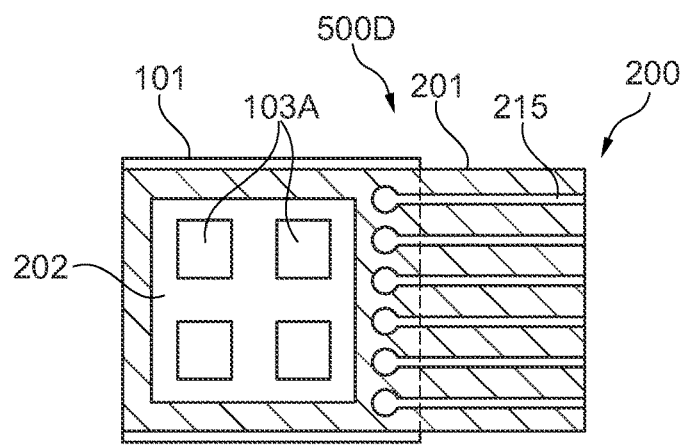

FIG. 4D illustrates a top view of the AiP device 500D along cross-section A-A in FIG. 4C. For simplicity, not all features of the AiP device 500D are shown. As illustrated in FIG. 4D, the flexible circuit 200 has an opening 202 which exposes the underlying antennas 103A. In other words, there is no metal region in the flexible circuit 200 that is disposed over (e.g., directly over) the antennas 103A, such that transmission and/or reception of RF signals by the antennas 103A may be performed without being blocked or attenuated. Note that the opening 202 in the flexible circuit 200 of FIG. 4D may be omitted in other embodiments, such as the AiP devices 500A, 500B, or 500C, because in those embodiments, the flexible circuit 200 is disposed between the antenna 103A and the RFIC 300 and therefore, may not interfere with the transmission and/or reception of RF signals by the antenna 103A. For example, in FIG. 1C, the antenna 103A is formed in a topmost metal layer (e.g., a metal layer furthest from the RFIC 300) of the substrate 100, while the flexible circuit 200 is proximate to a bottommost metal layer (e.g., a metal layer closest to the RFIC 300) of the substrate 100. FIG. 4D also illustrates conductive features 215 (e.g., copper lines, vias) formed in the flexible circuit 200, which are connected to the connector 203 (see FIG. 4C) and are used for electrical connection between the RFIC 300 and another PCB board or other electrical component.

Figure 5A:
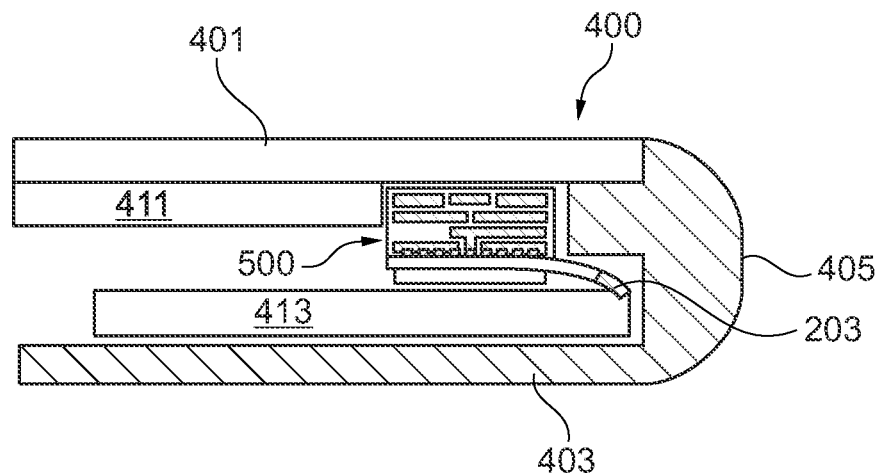
FIG. 5A is a cross-sectional view illustrating the electrical connection between an antenna-in-package (AiP) device and another electrical component inside an electronic device, in an embodiment.

FIG. 5A is a cross-sectional view illustrating the electrical connection between an embodiment antenna-in-package (AiP) device 500 (e.g., 500A, 500B, 500C, or 500D) and another electrical component inside an electronic device 400, in an embodiment. The electronic device 400 may be a cell phone, a tablet, a laptop, a speaker, a home assistant device, a TV set, or the like. For simplicity, not all features of the electronic device 400 and the AiP device 500 are illustrated in FIG. 5A. In the illustrated embodiment, the electronic device 400 is a cell phone with a front side 401 (e.g., with an LCD display), a back side 403, and a bezel 405 between the front side 401 and the back side 403. FIG. 5A also illustrates electrical components 411 and 413 (e.g., PCBs) inside the electronic device 400. In the example of FIG. 5A, the connector 203 of the flexible circuit 200 of the AiP device 500 is a surface-mount type of connector, and is connected to the electrical component 413 using, e.g., a soldering process. The flexible circuit 200 allows for flexibility in choosing the location of the AiP device 500 inside the electronic device 400.

Figure 5B:
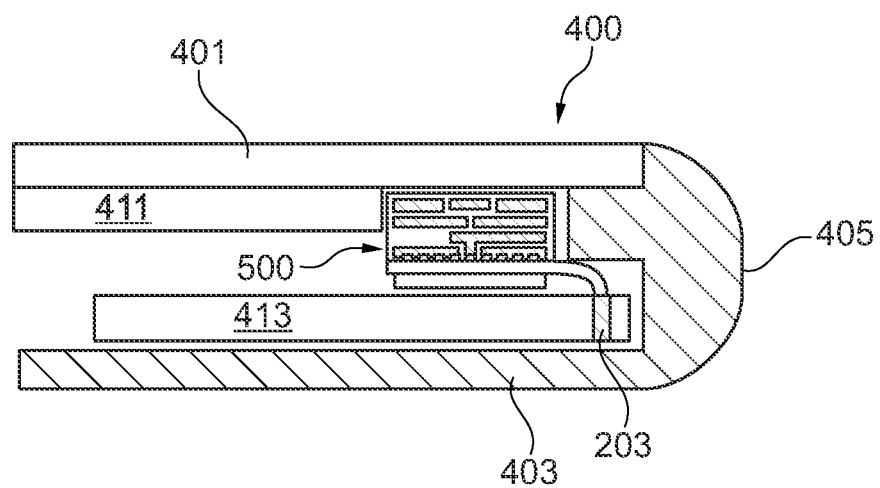
FIG. 5B is a cross-sectional view illustrating the electrical connection between an antenna-in-package (AiP) device and another electrical component inside an electronic device, in another embodiment.

FIG. 5B is a cross-sectional view illustrating the electrical connection between an embodiment antenna-in-package (AiP) device 500 (e.g., 500A, 500B, 500C, or 500D) and another electrical component inside an electronic device 400, in another embodiment. The embodiment of FIG. 5B is similar to that of FIG. 5A, but the connector 203 of the flexible circuit 200 of the AiP device 500 in FIG. 5B is a plug-in type of connector. Therefore, the connector 203 is connected to the electrical component 413 through an electrical socket.

Figure 6A:
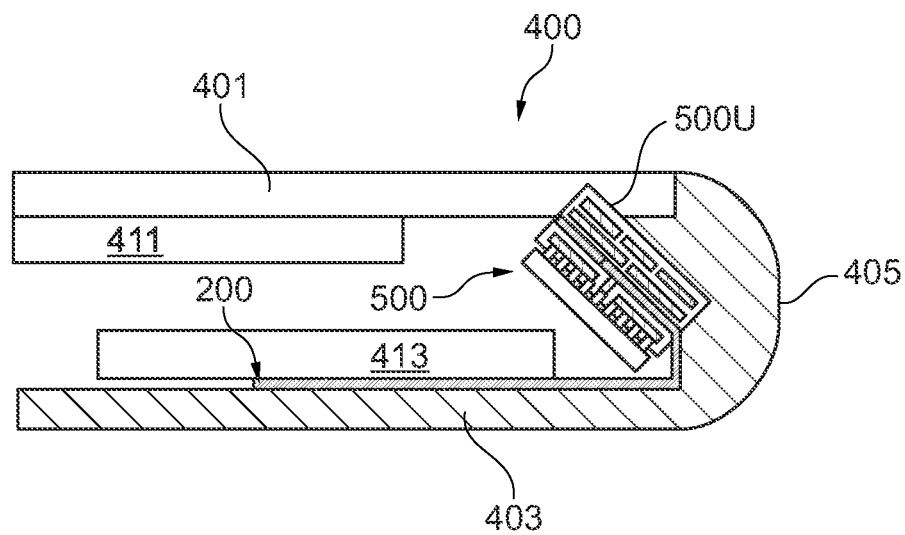
FIG. 6A is a cross-sectional view illustrating the location of an antenna-in-package (AiP) device inside an electronic device, in an embodiment.

FIG. 6A is a cross-sectional view illustrating the location of an embodiment antenna-in-package (AiP) device 500 (e.g., 500A, 500B, 500C, or 500D) inside an electronic device 400, in an embodiment. As illustrated in FIG. 6A, the flexible circuit 200 allows the AiP device 500 to be located at any suitable location within the electronic device 400. As cell phones get more and more slim, it is becoming increasingly difficult to fit packages such as AiP devices inside the cell phones. In the example of FIG. 6A, the flexible circuit 200 allows the AiP device 500 to be placed in the corner region of the cell phone next to the bezel 405, which corner region may provide more space for the AiP device 500. In addition, the AiP device 500 may be placed at an angle with respect to the cell phone. For example, the upper surface 500U of the AiP device 500 may form an angle of, e.g., about 45 degrees with the front side 401 of the electronic device 400.

Figure 6B:
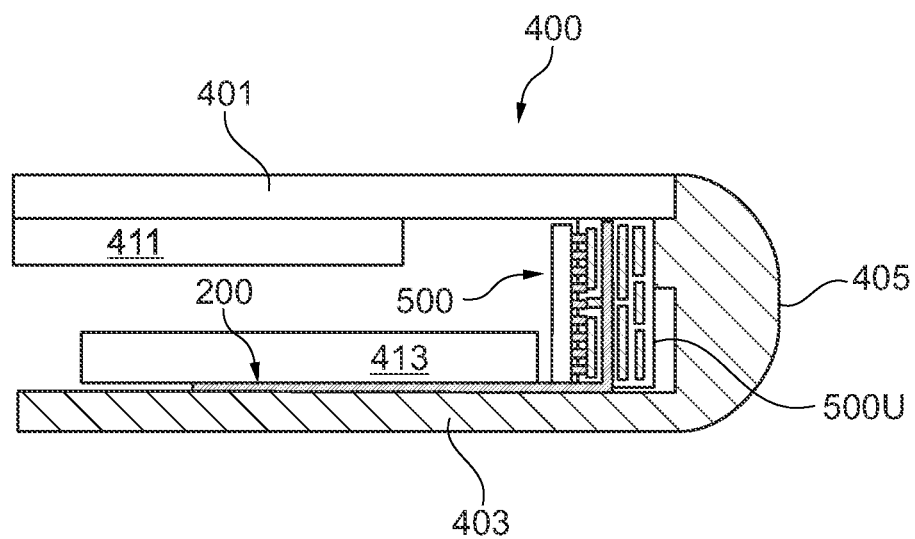
FIG. 6B is a cross-sectional view illustrating the location of an antenna-in-package (AiP) device inside an electronic device, in another embodiment.

FIG. 6B is a cross-sectional view illustrating the location of an embodiment antenna-in-package (AiP) device 500 (e.g., 500A, 500B, 500C, or 500D) inside an electronic device 400, in another embodiment. In the example of FIG. 6B, the upper surface 500U of the AiP device 500 forms an angle of 90 degrees with the front side 401 of the electronic device 400. Other angles and locations of the AiP device 500 within the mobile device are also possible, and are fully intended to be included within the scope of the present disclosure. The flexibility in the location of the AiP device 500, afforded by the disclosed structure of the AiP device 500, makes it easier to fit the AiP device 500 into various mobile devices.

Figure 7:
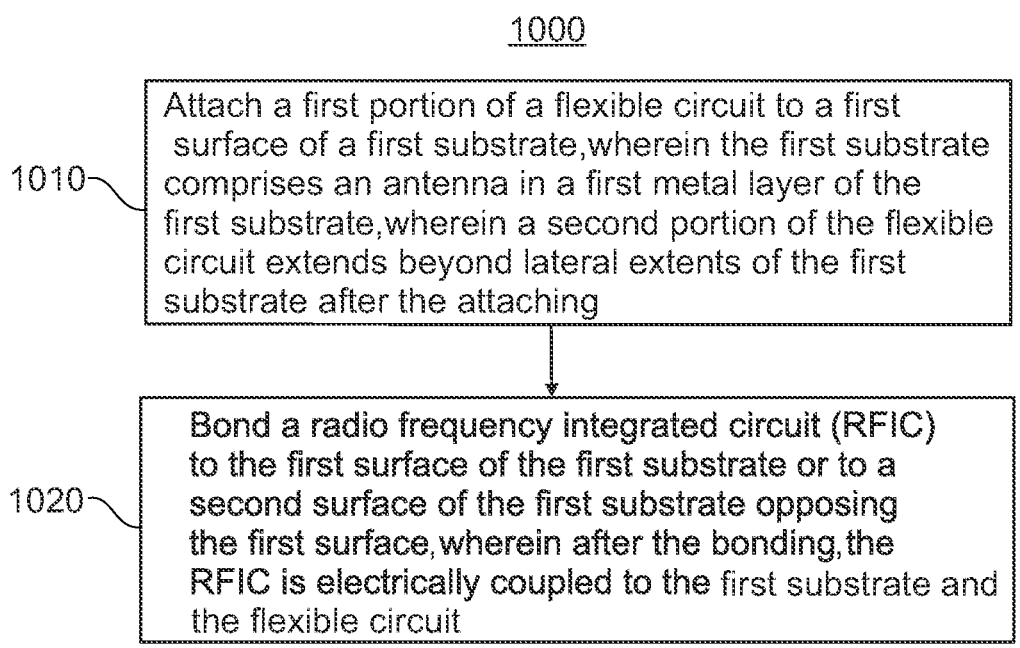
FIG. 7 is a flow chart of a method of forming a semiconductor device, in an embodiment.

FIG. 7 illustrates a flow chart of a method 1000 of forming an electrical device, in accordance with some embodiments. It should be understood that the embodiment method shown in FIG. 7 is merely an example of many possible embodiment methods. One of ordinary skill in the art would recognize many variations, alternatives, and modifications. For example, various steps as illustrated in FIG. 7 may be added, removed, replaced, rearranged and repeated.

The method 1000 may be used to fabricate various AiP devices with embedded flexible circuit, such as the AiP devices 500A, 500B, 500C, or 500D. Referring to FIG. 7, at step 1010, a first portion of a flexible circuit is attached to a first surface (e.g., an upper surface or a lower surface) of a first substrate, wherein the first substrate comprises an antenna in a first metal layer of the first substrate, wherein a second portion of the flexible circuit extends beyond lateral extents of the first substrate after the attaching. At step 1020, a radio frequency integrated circuit (RFIC) (e.g., 300) is bonded to the first surface of the first substrate or to a second surface of the first substrate opposing the first surface, wherein after the bonding, the RFIC is electrically coupled to the first substrate and the flexible circuit.

Embodiments may achieve advantages. For example, various embodiments disclosed herein form different AiP devices with embedded flexible circuits. The electrical connection between the AiP device and an external electrical component is achieved through a connector of the flexible circuit, which obviates the need to form large external connectors, such as solder bumps or conductive pillars on the AiP device. This reduces the height of the AiP device formed, which allows the AiP device to fit into small mobile devices. In addition, the flexible circuit embedded in the AiP device allows for flexibility in choosing the location of the AiP device within the mobile device, which allows the AiP devices to fit into even smaller mobile devices. Furthermore, the flexible circuit 200 is designed for easy integration with the substrate 100 without negatively impacting the RF performance. For example, the opening 202 in the flexible circuit 200 (see FIG. 4D) allows RF signals to be transmitted and/or received by the antennas 103A without being attenuated or blocked by the flexible circuit.

Embodiments of the present invention are summarized here. Other embodiments can also be understood from the entirety of the specification and the claims filed herein.

EXAMPLE 1

In an embodiment, a semiconductor device includes a substrate comprising an antenna and a conductive feature; an integrated circuit (IC) die attached to the substrate and comprising a radio frequency (RF) circuit; and a flexible circuit integrated with the substrate, wherein the flexible circuit is electrically coupled to the IC die and the substrate, a first portion of the flexible circuit being disposed between opposing sidewalls of the substrate, a second portion of the flexible circuit extending beyond the opposing sidewalls of the substrate, the second portion of the flexible circuit comprising an electrical connector at a distal end.

EXAMPLE 2

The semiconductor device of example 1, wherein the first portion of the flexible circuit extends parallel to a first side of the substrate and physically contacts the substrate.

EXAMPLE 3

The semiconductor device of example 1, wherein the substrate comprises a bottommost metal layer facing the IC die, wherein the first portion of the flexible circuit is disposed between the bottommost metal layer of the substrate and the IC die.

EXAMPLE 4

The semiconductor device of example 1, wherein the substrate comprises a bottommost metal layer facing the IC die and a topmost metal layer facing away from the IC die, wherein the first portion of the flexible circuit is disposed between the topmost metal layer and the bottommost metal layer.

EXAMPLE 5

The semiconductor device of example 1, wherein the substrate comprises a topmost metal layer facing away from the IC die, wherein the topmost metal layer is disposed between the flexible circuit and the IC die.

EXAMPLE 6

The semiconductor device of example 5, wherein the first portion of the flexible circuit has an opening, wherein the antenna of the substrate is exposed by the opening.

EXAMPLE 7

The semiconductor device of example 1, wherein the IC die has an RF terminal configured to transmit or receive an RF signal, wherein the conductive feature of the substrate is electrically coupled to the RF terminal of the IC die.

EXAMPLE 8

The semiconductor device of example 7, wherein the substrate further comprising a ground plane between the antenna and the conductive feature, wherein the ground plane has an opening that is disposed between the antenna and the conductive feature.

EXAMPLE 9

The semiconductor device of example 1, wherein the substrate comprises a first solder resist layer at a first side of the substrate and a second solder resist layer at a second side of the substrate opposing the first side, wherein the first portion of the flexible circuit is disposed between the first solder resist layer and the second solder resist layer.

EXAMPLE 10

The semiconductor device of example 1, further comprising a conductive via that extends through the flexible circuit and electrically couples the flexible circuit with a conductive line of the substrate.

EXAMPLE 11

A semiconductor device includes an integrated circuit (IC) that comprises a radio frequency (RF) circuit and an RF terminal configured to transmit or receive RF signals; a substrate comprising an antenna proximate to a first side of the substrate facing away from the IC and comprising a conductive feature proximate to a second side of the substrate facing the IC, wherein the IC is attached to the second side of the substrate, and the RF terminal of the IC is electrically coupled to the conductive feature of the substrate; and a flexible circuit attached to the substrate, wherein the flexible circuit is electrically coupled to the IC and the substrate, wherein a first segment of the flexible circuit is disposed within lateral extents of the substrate, and a second segment of the flexible circuit is disposed outside the lateral extents of the substrate, the second segment of the flexible circuit comprising an electrical connector.

EXAMPLE 12

The semiconductor device of example 11, wherein the first segment of the flexible circuit is disposed between the IC and metal layers of the substrate.

EXAMPLE 13

The semiconductor device of example 11, wherein metal layers of the substrate are disposed between the first segment of the flexible circuit and the IC.

EXAMPLE 14

The semiconductor device of example 11, wherein the first segment of the flexible circuit is disposed between a topmost metal layer of the substrate and a bottommost metal layer of the substrate.

EXAMPLE 15

The semiconductor device of example 11, wherein a length of the second segment of the flexible circuit is between about 0.5 mm and about 10 mm.

EXAMPLE 16

A method of forming an electrical device includes attaching a first portion of a flexible circuit to a first substrate, wherein the first substrate comprises an antenna in a first metal layer of the first substrate, wherein a second portion of the flexible circuit extends beyond lateral extents of the first substrate after the attaching, the second portion of the flexible circuit having an electrical connector at a distal end; and bonding a radio frequency integrated circuit (RFIC) to a first surface of the first substrate, wherein after the bonding, the RFIC is electrically coupled to the first substrate and the flexible circuit.

EXAMPLE 17

The method of example 16, further comprising, after attaching the first portion of the flexible circuit and before bonding the RFIC, attaching the first portion of the flexible circuit to a second substrate such that the first portion of the flexible circuit is between the first substrate and the second substrate.

EXAMPLE 18

The method of example 16, wherein bonding the RFIC comprises: forming openings in the flexible circuit to expose conductive features of the flexible circuits; and bonding conductive pillars of the RFIC with the conductive features of the flexible circuit.

EXAMPLE 19

The method of example 16, wherein bonding the RFIC comprises: forming openings in the first substrate to expose conductive features of the first substrate; and bonding conductive pillars of the RFIC with the conductive features of the first substrate.

EXAMPLE 20

The method of example 16, wherein attaching the first portion of the flexible circuit comprises attaching the first portion of the flexible circuit to a second surface of the first substrate opposing the first surface, wherein metal layers of the first substrate are between the flexible circuit and the RFIC after the attaching.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a substrate comprising an antenna and a conductive feature;
   an integrated circuit (IC) die attached to the substrate and comprising a radio frequency (RF) circuit; and
   a flexible circuit integrated with the substrate, wherein the flexible circuit is configured to be bendable at an angle of ninety degrees, wherein the substrate comprises a topmost metal layer contacting and extending along a topmost surface of the substrate distal from the IC die, wherein the topmost metal layer comprises the antenna, wherein the topmost metal layer is disposed between the flexible circuit and the IC die, wherein the IC die is disposed outside of the flexible circuit and outside of the substrate, wherein the flexible circuit is electrically coupled to the IC die and the substrate, a first portion of the flexible circuit being disposed between opposing sidewalls of the substrate, a second portion of the flexible circuit extending beyond the opposing sidewalls of the substrate, the second portion of the flexible circuit comprising an electrical connector at a distal end, wherein the first portion of the flexible circuit has an opening, wherein the antenna of the substrate is exposed by the opening.

2. The semiconductor device of claim 1, wherein the flexible circuit comprises a dielectric material and conductive layers disposed in the dielectric material, wherein a first outermost surface of the dielectric material in the first portion of the flexible circuit extends parallel to a first side of the substrate and physically contacts the substrate.

3. The semiconductor device of claim 2, wherein the electrical connector comprises a plurality of pins or a plurality of conductive pads, and is configured for electrical connection with another electrical component separated from the semiconductor device.

4. The semiconductor device of claim 1, wherein the IC die has an RF terminal configured to transmit or receive an RF signal, wherein the conductive feature of the substrate is electrically coupled to the RF terminal of the IC die.

5. The semiconductor device of claim 4, wherein the substrate further comprising a ground plane between the antenna and the conductive feature, wherein the ground plane has an opening that is disposed between the antenna and the conductive feature, wherein the antenna is configured to be electromagnetically coupled to the conductive feature of the substrate.

6. The semiconductor device of claim 4, wherein the substrate has an outermost dielectric layer at a bottommost surface of the substrate facing the IC die, wherein the RF terminal of the IC die extends to the outermost dielectric layer to be electrically coupled to the conductive feature of the substrate.

7. The semiconductor device of claim 1, further comprising a first solder resist layer at a first side of the substrate and a second solder resist layer at a second side of the substrate opposing the first side, wherein the first portion of the flexible circuit is disposed between the first solder resist layer and the second solder resist layer.

8. A semiconductor device comprising:
- an integrated circuit (IC) comprising a radio frequency (RF) circuit and an RF terminal configured to transmit or receive RF signals;
- a substrate comprising an antenna proximate to a first side of the substrate facing away from the IC and comprising a conductive feature proximate to a second side of the substrate facing the IC, wherein the IC is attached to the second side of the substrate, and the RF terminal of the IC is electrically coupled to the conductive feature of the substrate, wherein there is no direct electrical connection between the RF terminal of the IC and the antenna, and the antenna is configured to be electromagnetically coupled to the RF terminal of the IC to transmit or receive the RF signals; and
- a flexible circuit attached to the substrate, wherein the flexible circuit is configured to be bendable at an angle of ninety degrees, wherein the flexible circuit is electrically coupled to the IC and the substrate, wherein a first segment of the flexible circuit is disposed within lateral extents of the substrate, and a second segment of the flexible circuit is disposed outside the lateral extents of the substrate, the second segment of the flexible circuit comprising an electrical connector, wherein the antenna is disposed between the flexible circuit and the IC, wherein the first segment of the flexible circuit has an opening, wherein the antenna is exposed by the opening.

9. The semiconductor device of claim 8, wherein the conductive feature of the substrate is disposed between the first segment of the flexible circuit and the IC.

10. The semiconductor device of claim 8, wherein the flexible circuit comprises a dielectric material and conductive layers disposed between a first outermost surface of the dielectric material and an opposing second outermost surface of the dielectric material, wherein the first outermost surface of the dielectric material of the flexible circuit physically contacts the substrate.

11. The semiconductor device of claim 8, wherein the substrate comprises an outermost dielectric layer at the second side of the substrate, wherein the RF terminal of the IC extends to the outermost dielectric layer to be electrically coupled to the conductive feature of the substrate.

12. A method of forming an electrical device, the method comprising:
- attaching a first portion of a flexible circuit to a first substrate, wherein the first substrate comprises an antenna in a first metal layer of the first substrate, wherein the first portion of the flexible circuit has an opening, wherein after the attaching, the antenna is exposed by the opening, wherein a second portion of the flexible circuit extends beyond lateral extents of the first substrate after the attaching, the second portion of the flexible circuit having an electrical connector at a distal end; and
- after the attaching, bonding conductive pillars of a radio frequency integrated circuit (RFIC) to conductive features of the first substrate disposed at a first surface of the first substrate, wherein after the bonding, the RFIC is electrically coupled to the first substrate and the flexible circuit, wherein the bonding comprises:
  - forming openings in the first substrate to expose the conductive features of the first substrate; and
  - bonding the conductive pillars of the RFIC with the conductive features of the first substrate.

13. The method of claim 12, wherein the attaching comprises attaching the first portion of the flexible circuit to a second surface of the first substrate opposing the first surface, wherein the conductive features of the first substrate are between the flexible circuit and the RFIC after the bonding.

* * * * *